(12) United States Patent
Val

(10) Patent No.: US 7,877,874 B2
(45) Date of Patent: Feb. 1, 2011

(54) PROCESS FOR THE COLLECTIVE FABRICATION OF 3D ELECTRONIC MODULES

(75) Inventor: Christian Val, St Remy les Chevreuse (FR)

(73) Assignee: 3D Plus (FR)

( * ) Notice: Subject to any disclaimer, the term of this patent is extended or adjusted under 35 U.S.C. 154(b) by 413 days.

(21) Appl. No.: 12/158,125

(22) PCT Filed: Dec. 19, 2006

(86) PCT No.: PCT/EP2006/069948

§ 371 (c)(1),
(2), (4) Date: Jun. 19, 2008

(87) PCT Pub. No.: WO2007/071696

PCT Pub. Date: Jun. 28, 2007

(65) Prior Publication Data

US 2008/0289174 A1    Nov. 27, 2008

(30) Foreign Application Priority Data

Dec. 23, 2005  (FR) .................................. 05 13217

(51) Int. Cl.
*H01K 3/10* (2006.01)
(52) U.S. Cl. .............................. 29/852; 29/830; 29/841; 29/854; 361/728; 361/735; 361/792
(58) Field of Classification Search .................. 29/852, 29/417, 830, 831, 841, 854; 361/728, 735, 361/792, 796
See application file for complete search history.

(56) References Cited

U.S. PATENT DOCUMENTS

| 4,216,444 A | 8/1980 | Vergnolle et al. |
| 4,408,256 A | 10/1983 | Val |
| 4,413,170 A | 11/1983 | Val et al. |
| 4,518,818 A | 5/1985 | Le Ny et al. |

(Continued)

FOREIGN PATENT DOCUMENTS

DE    19842481    6/1999

(Continued)

OTHER PUBLICATIONS

U.S. Appl. No. 12/095,157, filed May 28, 2008, Christian Val et al.

(Continued)

*Primary Examiner*—Thiem Phan
(74) *Attorney, Agent, or Firm*—Lowe Hauptman Ham & Berner, LLP

(57) ABSTRACT

The invention relates to the collective fabrication of n 3D modules. A batch of n wafers I are fabricated on one and the same plate. This step is repeated K times. The K plates are stacked. Plated-through holes are formed in the thickness of the stack. These holes are intended for connecting the slices together. The stack is cut in order to obtain the n 3D modules. The plate 10, which comprises silicon, is covered on one face 11 with an electrically insulating layer forming the insulating substrate. This face has grooves 20 that define n geometrical features, which are provided with an electronic component 1 connected to electrical connection pads 2' placed on said face.

20 Claims, 6 Drawing Sheets

U.S. PATENT DOCUMENTS

| | | |
|---|---|---|
| 4,546,028 A | 10/1985 | Val |
| 4,553,020 A | 11/1985 | Val |
| 4,559,579 A | 12/1985 | Val |
| 4,639,826 A | 1/1987 | Val et al. |
| 4,654,694 A | 3/1987 | Val |
| 4,755,910 A | 7/1988 | Val |
| 5,002,895 A | 3/1991 | LeParquier et al. |
| 5,016,138 A * | 5/1991 | Woodman .................. 361/688 |
| 5,237,204 A | 8/1993 | Val |
| 5,323,533 A | 6/1994 | Val |
| 5,400,218 A | 3/1995 | Val |
| 5,461,545 A | 10/1995 | Leroy et al. |
| 5,502,667 A * | 3/1996 | Bertin et al. .................. 365/51 |
| 5,526,230 A | 6/1996 | Val |
| 5,637,536 A | 6/1997 | Val |
| 5,640,760 A | 6/1997 | Val et al. |
| 5,847,448 A | 12/1998 | Val et al. |
| 5,885,850 A | 3/1999 | Val |
| 6,307,261 B1 | 10/2001 | Val et al. |
| 6,380,629 B1 | 4/2002 | Kim |
| 6,391,685 B1 | 5/2002 | Hikita et al. |
| 2002/0191380 A1 | 12/2002 | Val |
| 2003/0013231 A1 | 1/2003 | Val |
| 2003/0173673 A1 | 9/2003 | Val |
| 2004/0221451 A1 | 11/2004 | Chia et al. |
| 2005/0012188 A1 | 1/2005 | Val |
| 2007/0117369 A1 | 5/2007 | Val et al. |
| 2007/0262443 A1 | 11/2007 | Val et al. |

FOREIGN PATENT DOCUMENTS

| | | |
|---|---|---|
| WO | WO03073505 | 9/2003 |

OTHER PUBLICATIONS

U.S. Appl. No. 89361, filed Oct. 30, 1979, Christian Val, abandoned Feb. 27, 1981.
U.S. Appl. No. 148043, filed Feb. 8, 1982, Christian Val, abandoned Feb. 8, 1982.
U.S. Appl. No. 201870, filed Nov. 3, 1980, Christian Val et al., abandoned Nov. 9, 1990.
U.S. Appl. No. 221437, filed Dec. 30, 1980, Herve Lacroix et al., abandoned Jun. 30, 1982.
U.S. Appl. No. 274205, filed Jan. 4, 1984, Jacques Le Ny et al., abandoned Dec. 2, 1993.
U.S. Appl. No. 296650, filed Aug. 27, 1981, Christian Val, abandoned Jan. 4, 1984.
U.S. Appl. No. 507808, filed Jun. 24, 1983, Christian Val, abandoned Sep. 26, 1985.
U.S. Appl. No. 735731, filed May 20, 1985, Christian Val abandoned Dec. 7, 1987.
U.S. Appl. No. 131238, filed Dec. 7, 1987, Christian Val, abandoned Jun. 2, 1981.
U.S. Appl. No. 361694, filed Jun. 2, 1989, Christian Val, abandoned Jun. 2, 1991.
U.S. Appl. No. 030854, filed May 12, 1987, Christian Val, abandoned Mar. 1, 1988.
U.S. Appl. No. 226512, filed Aug. 1, 1988, Christian Val, abandoned Nov. 15, 1989.
U.S. Appl. No. 920073, filed Oct. 16, 1986, Christian Val, abandoned Sep. 22, 1989.
U.S. Appl. No. 026228, filed Jan. 29, 1987, Christian Val, abandoned Apr. 2, 1996.
U.S. Appl. No. 092295, filed Sep. 2, 1987, Christian Val et al., abandoned Jan. 12, 1989.
U.S. Appl. No. 296797, filed Jan. 12, 1989, Christian Val et al., abandoned Sep. 15, 1989.
U.S. Appl. No. 407532, filed Sep. 15, 1989, Christian Val et al., abandoned May 21, 1990.
U.S. Appl. No. 527714, filed May 21, 1990, Christian Val et al., abandoned Oct. 28, 1991.
U.S. Appl. No. 181740, filed Apr. 14, 1988, Guy Pasquier et al., abandoned Nov. 3, 1989.
U.S. Appl. No. 272376, filed Nov. 17, 1988, Christian Val, abandoned Jul. 8, 1991.
U.S. Appl. No. 07/728,352, filed Jul. 8, 1991, Christian Val, abandoned Dec. 10, 1992.
U.S. Appl. No. 07/989,871, filed Dec. 10, 1992, Christian Val, abandoned Aug. 13, 1993.
U.S. Appl. No. 07/844,631, filed Aug. 23, 1991, Michel Leroy, abandoned Mar. 30, 1992.
U.S. Appl. No. 07/920,482, filed Dec. 6, 1991, Christian Val, abandoned Aug. 6, 1992.
U.S. Appl. No. 08/289,855, filed Aug. 12, 1994, Christian Val, abandoned Aug. 12, 1994.
U.S. Appl. No. 08/604,752, filed Feb. 23, 1996, Christian Val, abandoned Jun. 12, 1998.
U.S. Appl. No. 08/351,407, filed Apr. 15, 1994, Christian Val, abandoned Sep. 4, 1996.
U.S. Appl. No. 08/544,478, filed Oct. 18, 1995, Stephan Ronan et al., abandoned Mar. 3, 1997.
U.S. Appl. No. 11/910,433, filed Apr. 1, 2008, Val et al.
U.S. Appl. No. 07728325, filed Jul. 8, 1991, Christian Val, abandoned Dec. 10, 1992.

* cited by examiner

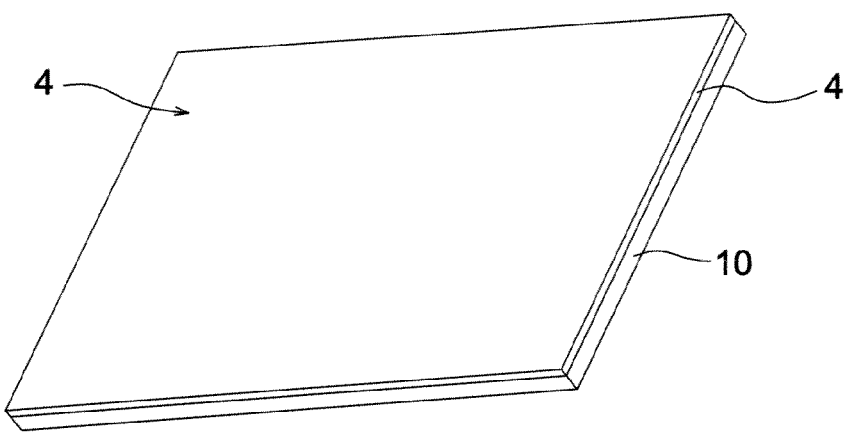
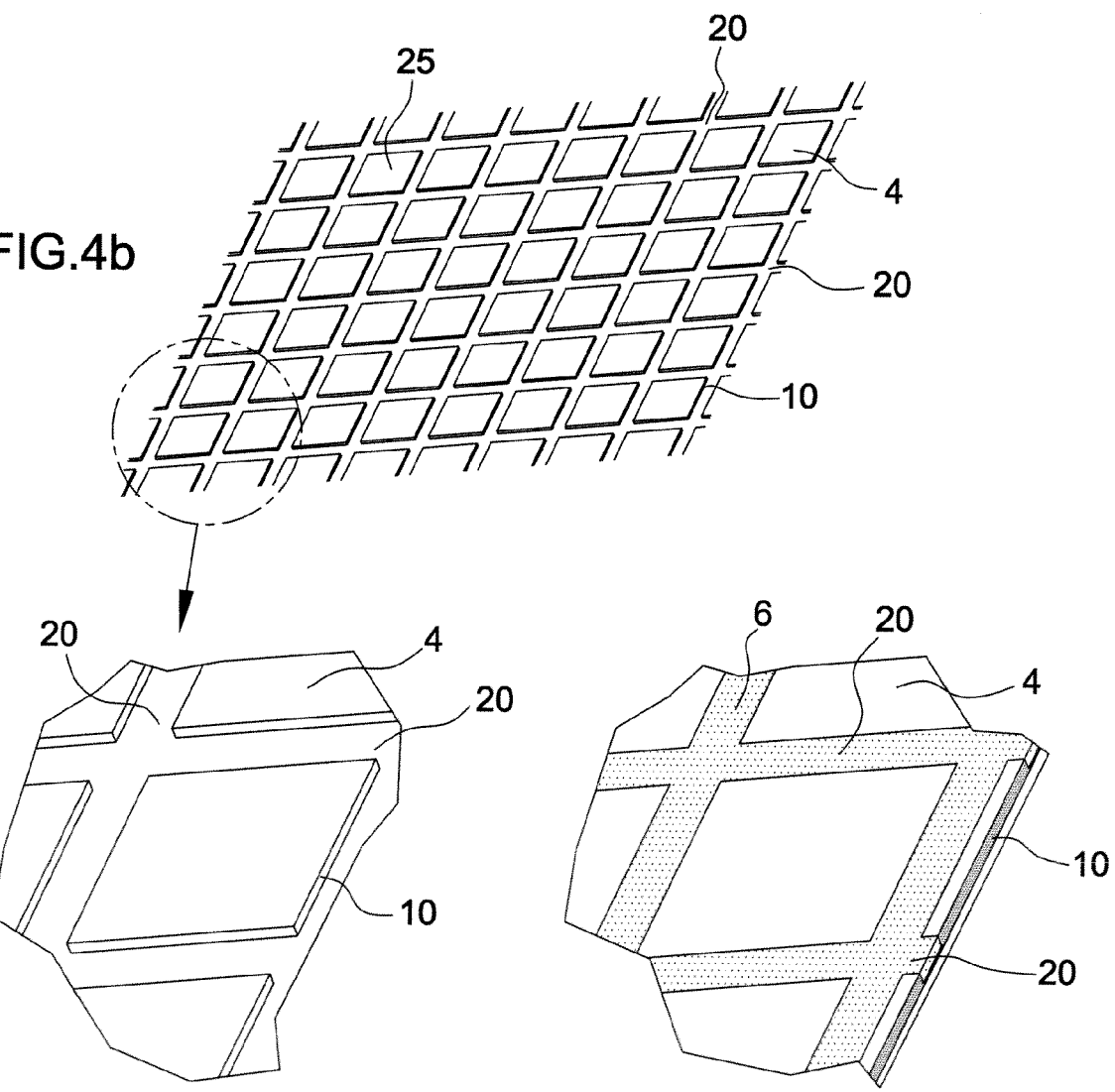
FIG.4a
FIG.4b
FIG.4b'  FIG.4c

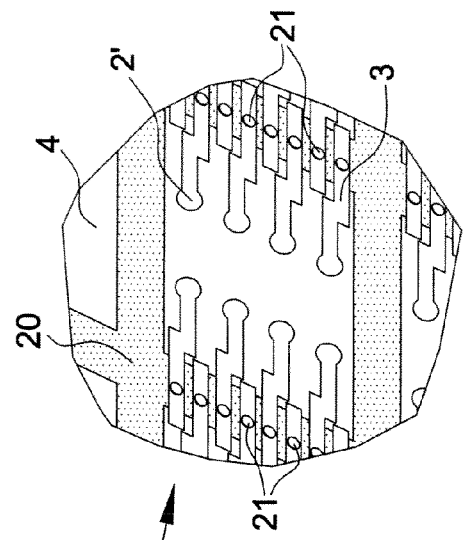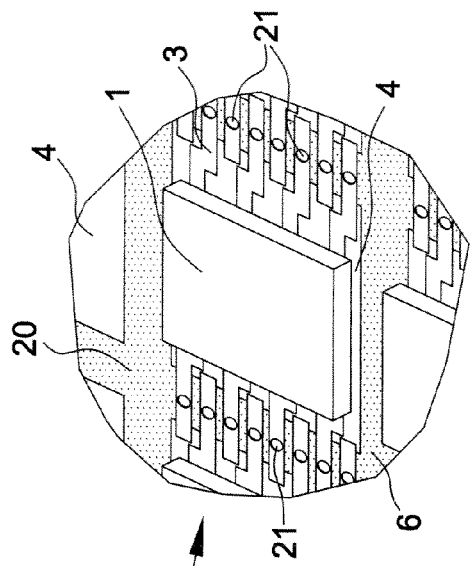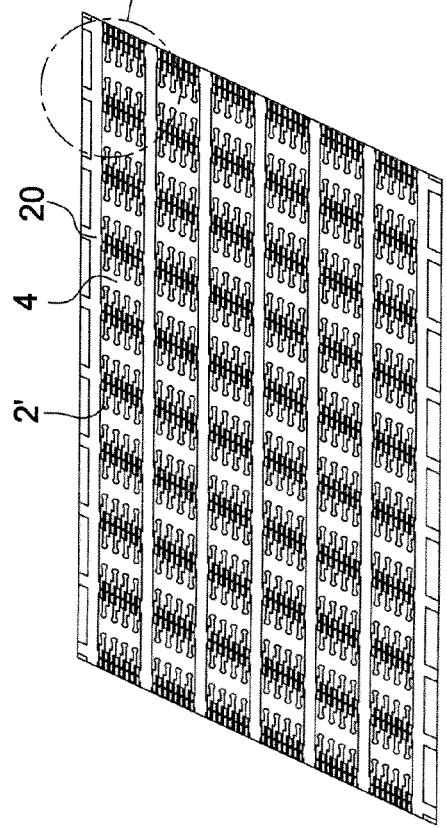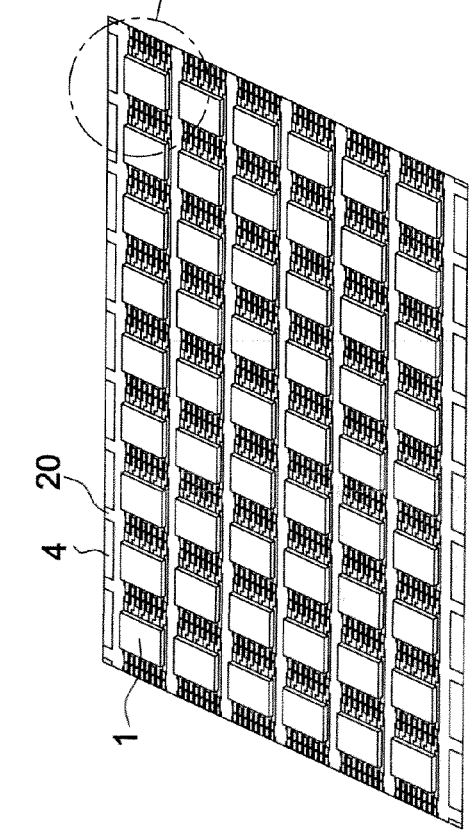
FIG.5a' FIG.5b'
FIG.5a FIG.5b

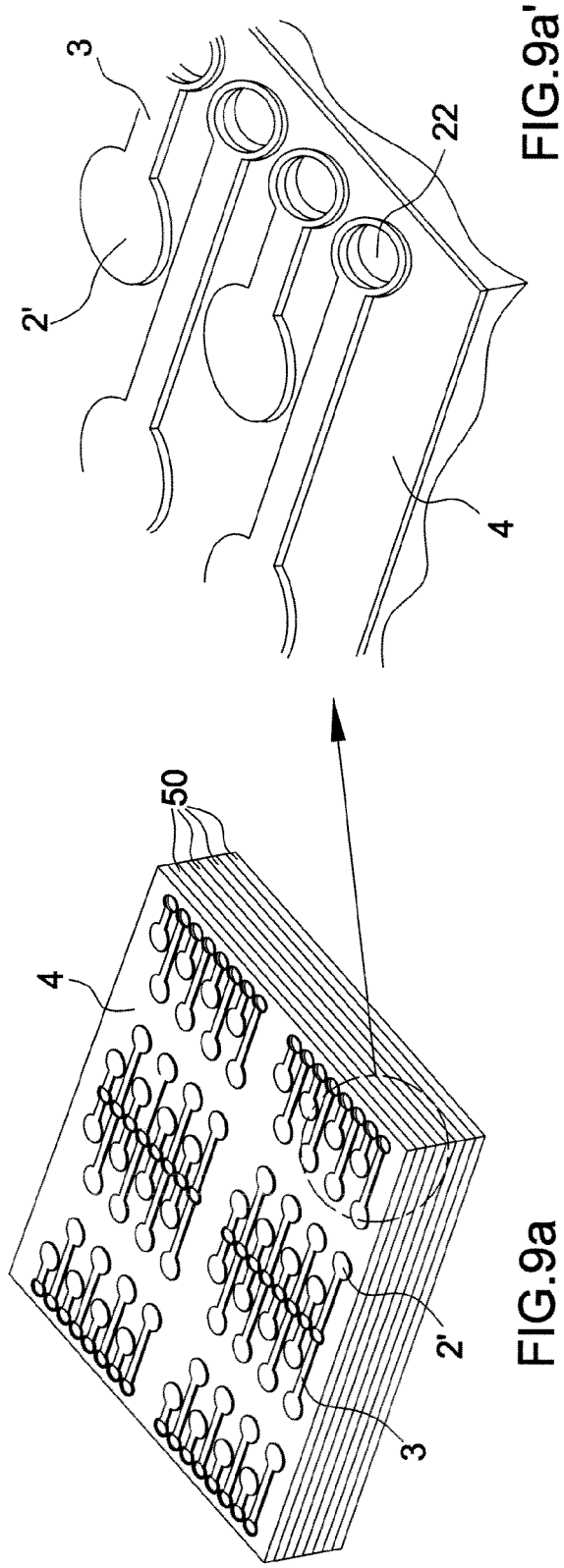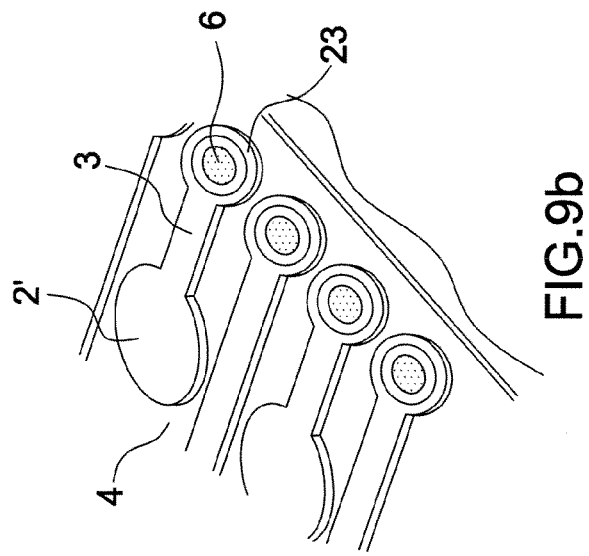

PROCESS FOR THE COLLECTIVE FABRICATION OF 3D ELECTRONIC MODULES

CROSS-REFERENCE TO RELATED APPLICATIONS

The present Application is based on International Application No. PCT/EP2006/069948, filed on Dec. 19, 2006, which in turn corresponds to French Application No. 0513217, filed on Dec. 23, 2005, and priority is hereby claimed under 35 USC §119 based on these applications. Each of these applications are hereby incorporated by reference in their entirety into the present application.

FIELD OF THE INVENTION

The field of the invention is that of the fabrication of 3D electronic modules.

BACKGROUND OF THE INVENTION

A 3D electronic module comprises a stack of electronic wafers, interconnected in three dimensions by using the faces of the stack to make the connections between the wafers. A wafer 5, one example of which is represented in FIG. 1, normally comprises one or more active components 1b or passive components 1a which have electrical connection elements 2b or 2a, the components being coated in an electrically insulating resin 6. The connection elements 2a or 2b of the components are linked to connection terminals supported by an electrically insulating substrate 4. One or more electrically conductive tracks 3 supported by the insulating substrate 4 interlink these components or interlink electrical connection elements of the wafers. The wafers are electrically interlinked by conductors located on the lateral faces of the stack, that is, on the edges 7 of the wafers.

There are several methods for connecting the terminals of the component to those of the substrate.

One method involves directly connecting the terminals of the component to those of the insulating substrate by sending ultrasounds. The energy sent is proportional to the number of terminals to be connected. For components with a large number of terminals, the energy needed for the connection sometimes causes the component to break. One solution for reducing this energy involves heating the substrate which is then softened and absorbs a portion of the ultrasound energy sent which renders the connection very difficult. Furthermore, when the components are coated by polymerization performed at approximately 150°, the substrate tends to bend because the expansion coefficient of the components differs from that of the substrate, typically four times less.

SUMMARY OF THE INVENTION

The aim of the invention is to overcome these drawbacks.

The principle of the invention is to retain a good continuity of material between the component and the substrate to avoid the expansion differences during the connection and/or polymerization step, while electrically insulating the components from each other.

More specifically, the subject of the invention is a method of fabricating n electronic modules, n being an integer greater than 1, a module comprising a stack of K electronic wafers, a wafer i, i varying from 1 to K comprising on an insulating substrate at least one electronic component, the K wafers being electrically interlinked by conductors located on the lateral sides of the stack, characterized in that the fabrication is collective and comprises: a first step consisting, for each wafer i, in:

A1) a step for fabricating a batch of n wafers i on one and the same flat thin sheet of thickness $e_p$ comprising silicon, covered on one face with a thin electrically insulating layer of thickness $e_i$, forming the substrate, with, on this face, grooves of width L1 and of depth greater than $e_i$ and less than $e_p+e_i$, these grooves delimiting at least n geometrical patterns, each pattern being provided with at least one electronic component connected to electrical connection terminals disposed on said face, the terminals being linked to electrical connection elements extending at least as far as a groove, a hole-opening area being provided at the intersection of the grooves and of the connection elements, the transverse dimension of this area being less than L1, the components being coated with an insulating resin which also fills the grooves, B1) a thinning step by surface grinding of the other face of the sheet so as to reveal the resin of the grooves, a second step consisting in:

A2) stacking and assembling the K batches obtained on completion of the first step, so as to superimpose the opening areas, substantially one on top of the other, B2) drilling holes in the resin perpendicularly to the faces of the sheets through the entire thickness of the stack plumb with the opening areas, the transverse dimension of the holes being less than L1, so that the silicon is insulated from the wall of the hole by the resin, C2) metallizing the wall of the holes, D2) cutting the stack along the grooves in order to obtain the n electronic modules.

Advantageously, it also comprises, prior to the second step, an additional step for thinning the sheet by surface grinding of the other face of the sheet.

According to one characteristic of the invention, it comprises a step consisting in depositing an electrically insulating layer on one face of the stack parallel to the sheets, this layer comprising, at the level of each pattern, elements for electrically interconnecting the module which provide opening areas centered on the opening areas of the wafers, and which extend as far as these areas.

According to another characteristic of the invention, the second step also comprises a step following the step for metallizing the walls of the holes, consisting in refilling the holes with resin in order to facilitate the subsequent cutting of the stack.

The electronic component can be an active component such as a bare chip or a passive component or an MEMS (acronym for the English expression Micro Electro Mechanical System).

The sheet is such that at least one passive component is located in or on the sheet.

According to a characteristic of the invention, the thin insulating layer is made of insulating resin.

According to another characteristic of the invention, the electrical connection elements straddle the grooves.

Where appropriate, electrical connection elements link two terminals located either side of a groove.

Preferably, it also comprises, prior to the cutting of the step D2, a step consisting in electrically testing the resulting stack.

According to one embodiment of the invention, the electrical connection elements are etched bridges. They are etched after having filled the grooves with resin and before coating the components with resin.

According to another embodiment of the invention, the electrical connection elements are wired filaments, possibly cropped along the grooves.

The holes are drilled by dry or liquid etching.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

From one figure to another, the same elements are identified by the same references.

DETAILED DESCRIPTION OF THE INVENTION

Figure 10:
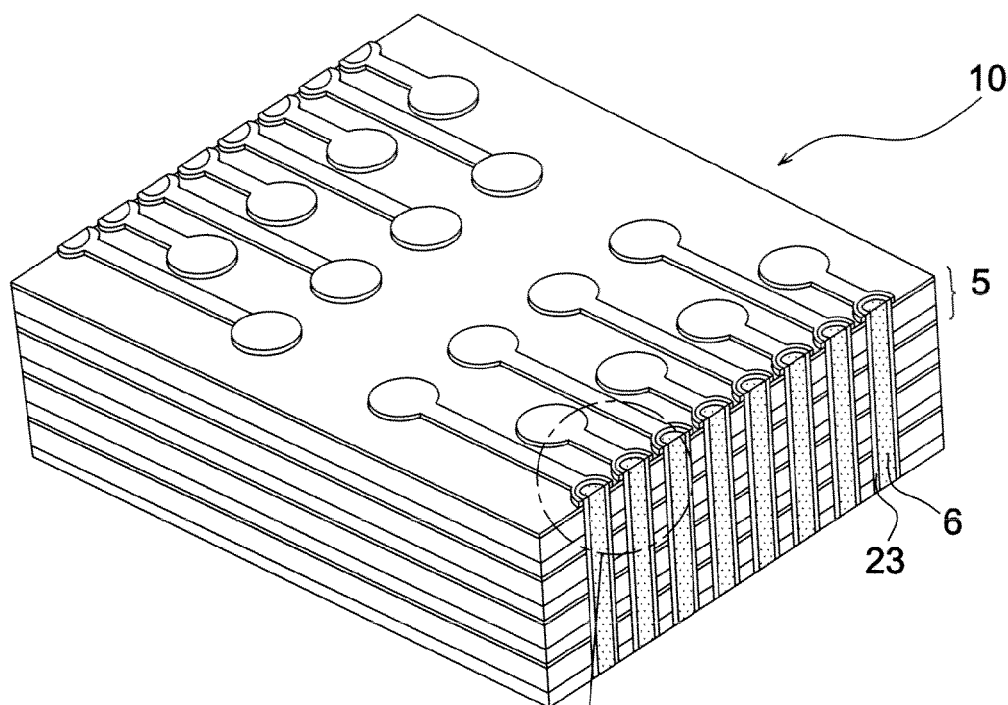
Figure 10:
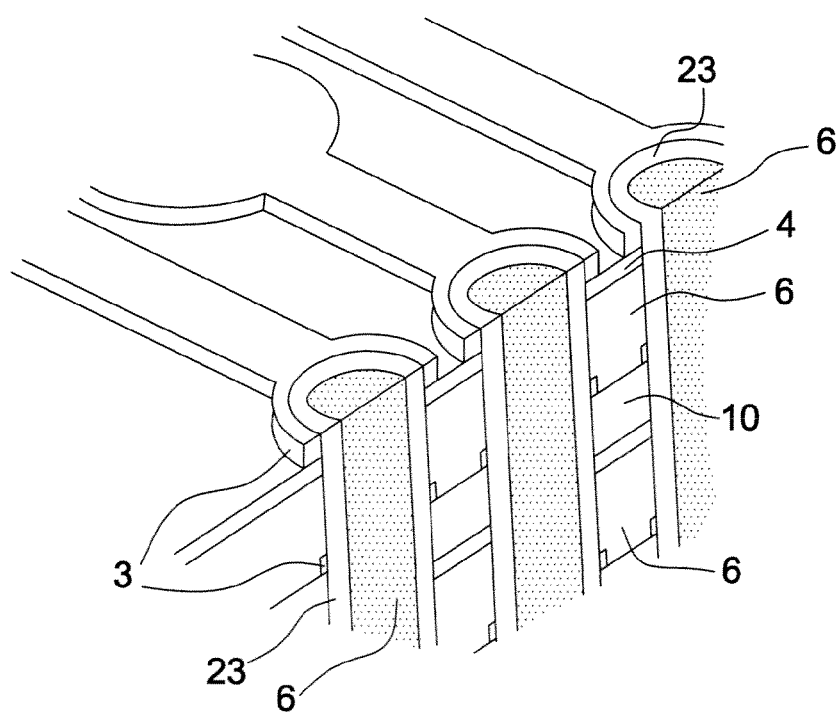

A 3D electronic module 100, one example of which is represented in FIG. 10, comprises a stack of K electronic wafers 5; a wafer i, i varying from 1 to K, comprises, on an insulating substrate 4, at least one electronic component 1. The K wafers are electrically interlinked by conductors 23 located on the lateral faces of the stack. K is, for example, equal to 4, but typically varies between 2 and 100.

The invention relates to the fabrication of n modules (n between 2 and 500), this fabrication being collective.

It comprises a step for fabricating a batch of n wafers i on one and the same sheet, this step being repeated K times, then a step for stacking the K sheets, for forming metallized holes in the thickness of the stack and intended to interconnect the wafers, then for cutting the stack to obtain the n 3D modules.

Figure 1:
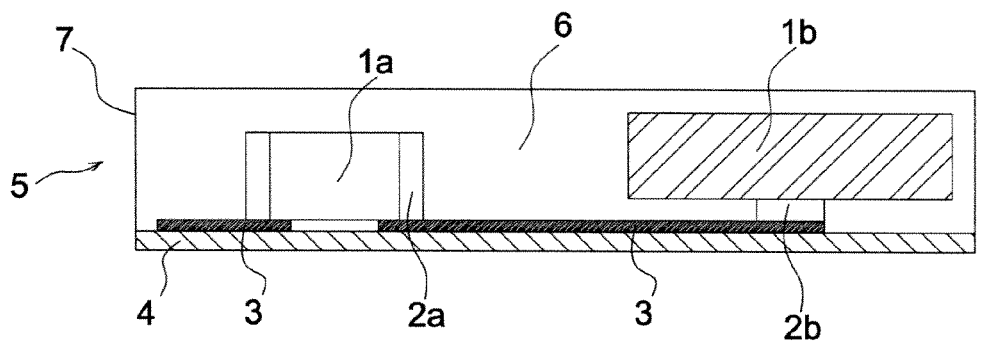
FIG. 1, already described, diagrammatically represents an electronic wafer of a 3D module, according to the state of the art, FIG. 2 diagrammatically represents an electronic wafer obtained according to the invention before thinning, FIG. 3 diagrammatically represents a stack of four wafers obtained according to the invention, FIGS. 4a to 4c diagrammatically represent the steps for grooving a silicon sheet according to the invention, and filling the grooves, FIG. 4b' being a large-scale detail of FIG. 4b, FIG. 5a and its large-scale detail in FIG. 5a' diagrammatically represent the step for distributing electrical connection elements over the sheet obtained on completion of the step shown in FIG. 4c, FIG. 5b and its large-scale detail in FIG. 5b' diagrammatically represents the step for surface-mounting electronic components, FIG. 6 diagrammatically represents the step for coating the components, FIG. 7 diagrammatically represents the double-sided thinning step, FIG. 8 diagrammatically represents the stacking and assembly step, FIG. 9a and its large-scale detail in FIG. 9a' diagrammatically represent the step for depositing an insulating layer on a face of the stack and distributing interconnection elements and drilling holes, FIG. 9b diagrammatically represents the deposition of a metallic layer in the holes and the refilling of the metallized holes with resin, FIG. 10 and its large-scale detail in FIG. 10' diagrammatically represent a 3D module obtained after cutting.
Figure 2:
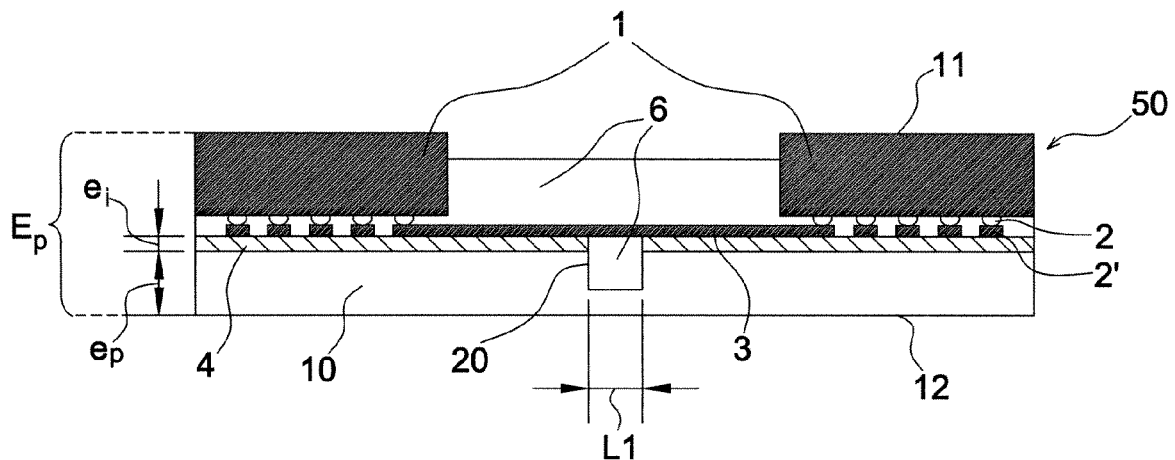

A batch 50 of n wafers i, one example of which is represented in FIG. 2, is obtained on one and the same flat thin sheet 10 of thickness $e_p$ comprising silicon. The thickness of the sheet 10 is of the order of a few hundreds of μm. Passive components are, where appropriate, already in or on the sheet. This sheet is used to maintain a continuity during the collective fabrication. It is, for example, a circular sheet with a diameter of approximately 25 cm.

It is covered on one face 11 with a thin electrically insulating layer forming the insulating substrate 4 of thickness $e_i$, of a few μm. This face has grooves 20 of width L1 (L1 is typically between 100 μm and 200 μm) and of a depth greater than $e_i$ and less than $e_p + e_i$; these grooves delimit at least n geometrical patterns 25, each pattern being provided with at least one electronic component 1 made of silicon connected to electrical connection terminals 2' disposed on said face. A component typically has a thickness of between 50 μm and 500 μm. The terminals 2' are linked to electrical connection elements of the component such as tracks 3 which extend at least as far as a groove 20, an opening area 21 for a hole being provided at the intersection of the grooves 20 and of the interconnection elements 3. The dimensions of these opening areas may differ from one sheet to another. There is, for example, a circular area. The components 1 are coated with an insulating resin 6 which also fills the grooves 20. The sheet 10 is thinned by surface grinding on the other face 12 so as to reveal the resin in the grooves. The thickness $e_p$ is then between a few μm and 100 μm. These grooves 20 thus make it possible to electrically insulate each 3D module 100. The surface grinding is performed by mechanical or chemical abrasion.

Preferably, the method also comprises a step consisting in thinning the sheet provided with its components by surface grinding on the side of the face 11 of the sheet, that is, by surface grinding the components and possibly the resin. The thickness $E_p$ of the sheet and of its components, is then reduced by surface grinding performed on both faces of the sheet provided with its components. The resulting thickness is, for example: 50 μm<$E_p$<200 μm.

Figure 3:
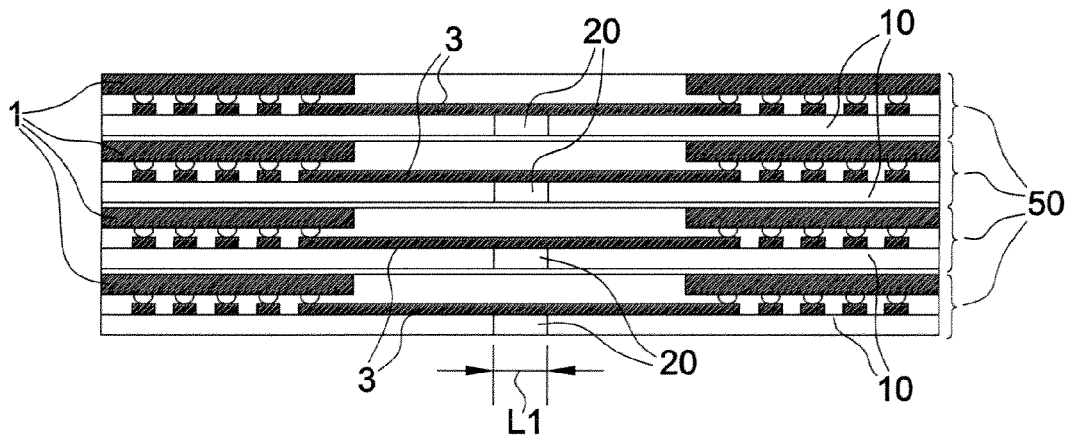

A second step consists in stacking and assembling the K batches obtained on completion of the first step, as illustrated in FIG. 3, so as to superimpose the opening areas 21 of each batch 50, substantially one on top of the other. These areas 21 are preferably of the same dimensions, but not necessarily. Holes 22 are then drilled perpendicularly to the faces of the sheets through the thickness of the stack plumb with the opening areas 21; the transverse dimension of the holes is less than L1, so that the silicon of each wafer 10 is insulated from the wall of the hole by the resin. When the hole is circular, its diameter is, for example, from 50 μm to 100 μm. The wall of the holes 21 is then metallized with a metal layer 23. The stack is cut along the grooves 20 in order to obtain the n electronic modules 100. This cutting is, for example, performed by sawing.

The thin insulating layer 4 is possibly made of insulating resin.

Preferably, a step is provided prior to the cutting of the stack, which consists in electrically testing the resulting stack. This provides a way of performing this test collectively rather than individually on each module obtained.

Advantageously, prior to the cutting of the stack, it comprises a step consisting in depositing a drum skin on one of the two faces of the stack.

There now follows a description of two exemplary embodiments.

According to a first embodiment, described in relation to FIGS. 4 to 10, a thin layer 4 of an insulating material is deposited on one face 11 of the sheet, then grooves 20 are cut in the sheet on this same face according, for example, to one and the same rectangular pattern 25 (FIGS. 4a, 4b and 4b'). Insulating resin 6 is then deposited in the grooves 20 (FIG. 4c).

According to a variant, the grooves are cut in the bare sheet and the resin 6 is deposited once in the grooves and on the sheet so as to form the thin layer 4 on said sheet.

The electrical connection areas 2', that is, the terminals for connecting to the components and the component interconnecting elements such as tracks 3 (FIG. 5a), are produced on this face of the sheet by etching for example, using a conventional method known to those skilled in the art. The interconnection element 3 extends at least as far as the groove 20, or even forms a bridge which straddles it as can be seen in FIGS. 5a' and 5b'. If necessary, it is hollowed out at the intersection with the groove 20 to form an opening area 21 (FIGS. 5a' and 5b') intended for the drilling of a hole when the sheets are stacked and to electrically insulate the components from each other with a view to a subsequent collective test. When this test is not provided, the opening area 21 can be formed by providing a continuity of the interconnection element at the level of the groove, for example when this element links two connection terminals located either side of the groove 20.

The components 1 are surface-mounted on this face of the sheet at the level of the patterns 25, active face towards the sheet according to a so-called "Flip Chip" method so as to connect each component with its connection terminals (FIGS. 5b and 5b').

Figure 6:
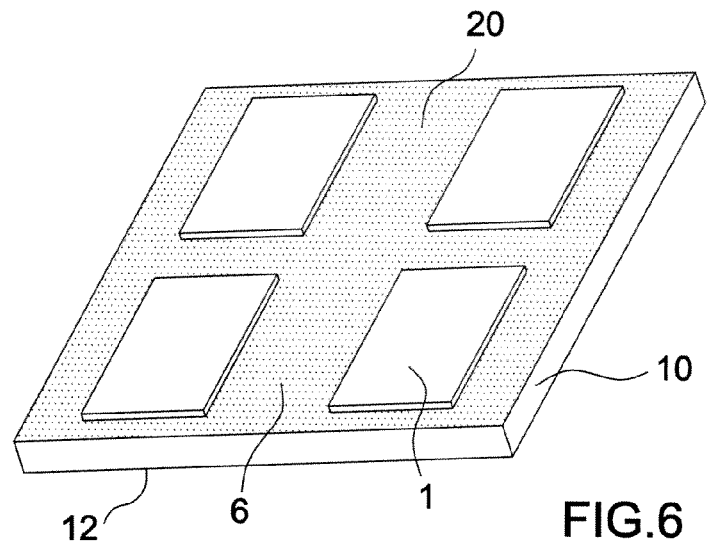

The components 1 are then coated with an insulating resin 6 in a conventional manner (FIG. 6).

Until this step, the silicon sheet 10 provides a continuous support for fabricating the batch of n wafers i. This continuity disappears in the next step.

Figure 7:
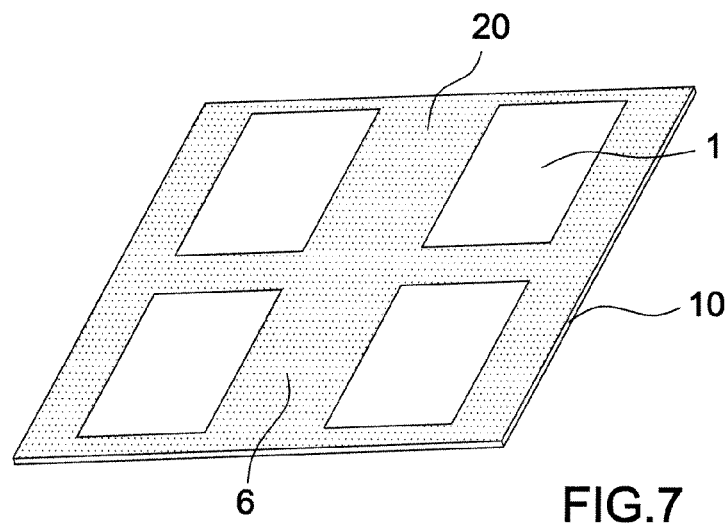

In practice, the sheet is then thinned by surface grinding on the other face 12 so as to reveal the resin 6 of the grooves (FIG. 7).

The fabrication of this batch 50 of n wafers is repeated K times in order to obtain the K sheets.

Figure 8:
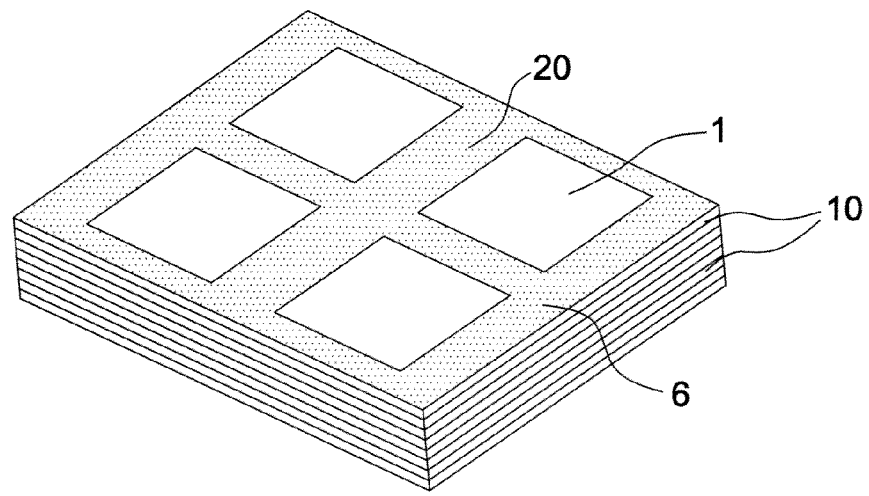

The K sheets are stacked one on top of the other by gluing for example, by lining up the opening areas (FIG. 8).

An insulating layer 4 is deposited on a face of the stack parallel to the sheets 10, on which are located electrical interconnection elements 2' and 3 of the stack. An opening area 21 centered on the opening areas of the wafers is also provided. The interconnection elements that are intended to be linked to the wafers therefore extend as far as this area. This layer can be produced on the stack or before stacking, then added to the latter.

The holes 22 or vias are drilled through the stack plumb with the opening area of this last layer (FIG. 9a'); this drilling 22 is obtained through a mask for example by using a plasma dry etching process (or "RIE", an acronym standing for the English expression Reactive Ion Etching) or by excimer-type laser ablation. The etching is stopped when the hole is drilled. On completion of this etching, the holes obtained have a transverse dimension (that is, a dimension in the direction of the width of the groove) less than L1 so that the silicon of the sheets is insulated from the wall of the hole 22 by the resin 6, and the bridges are flush with the wall of the holes.

The wall of the holes is then metallized with a metallic layer 23 (FIG. 9b), which makes it possible to establish a connection between the flush bridges and the hole and therefore establish a connection between the wafers.

The holes 22 are possibly filled with resin 6 in order to facilitate the cutting which is normally performed by sawing (FIGS. 9b and 10 and 10').

The stack is cut along the grooves, in order to obtain the n electronic modules 100 (FIG. 10).

According to another embodiment, a thin layer of an insulating material is deposited on one face of the sheet and forms the substrate. Electrical connection terminals of the components and of the electrical interconnection elements to which they are linked, are disposed on said face. The interconnection elements of the components are disposed so as to provide a location for the grooves which are then formed according, for example, to one and the same rectangular pattern.

The components are surface-mounted on this face of the sheet in each pattern, active face towards the sheet according to a so-called "Flip Chip" method so as to connect each component with its connection terminals. The connection elements are linked to filaments intended to be flush with the walls of the future holes. To this end, they at least partially straddle the grooves. Possibly, these filaments link connection elements located either side of a groove. Given the slenderness of these filaments of the order of 25 μm in diameter, there is de facto an opening area located at the intersection of the filaments and of the groove, wider of course than the filaments and intended for the drilling of a hole when the sheets are stacked.

The components are coated with an insulating resin which also fills the grooves. As for the preceding embodiment, these grooves provide a way of electrically insulating each module.

Possibly, when the filaments link connection elements located either side of a groove, they are cut along the grooves over a width L2 less than L1: the resin located in this position is therefore also cut.

Until this step, the silicon sheet provides a continuous support for fabrication of the batch of n wafers i. This continuity disappears in the next step.

The sheet is then thinned by surface grinding on the other face so as to reveal the resin of the grooves. The surface grinding is performed by mechanical or chemical abrasion.

The fabrication of this batch of n wafers is repeated K times in order to obtain the K sheets.

The K sheets are stacked one on top of the other by gluing for example, by lining up the opening areas.

An insulating layer is deposited on a face of the stack parallel to the sheets, on which are disposed electrical interconnection elements of the stack. An opening area centered on the opening areas of the wafers is also provided. The interconnection elements that are intended to be linked to the wafers therefore also extend as far as this area. This layer can be produced before the stack and then added to the latter.

The holes or vias are drilled through the stack plumb with the opening area. This drilling is obtained through a mask for example by using a photolithographic liquid etching so that the resin located plumb with the filaments is also eliminated when the wires straddle the groove; otherwise, a dry etching such as that described previously can be used. The etching is stopped when the hole is drilled. On completion of this etching, the holes obtained have a transverse dimension (that is, a dimension in the direction of the width of the groove) less than L1 so that the silicon of the wafers is insulated from the wall of the hole by the resin, and the filaments are flush with the wall of the holes.

The wall of the holes is then metallized, which provides a way of establishing a connection between the flush filaments and the hole and therefore establish a connection between the wafers.

The holes are possibly filled with resin in order to facilitate the cutting.

The stack is cut along the grooves, in order to obtain the n electronic modules.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of fabricating n electronic modules, n being an integer greater than 1, a module comprising a stack of K electronic wafers, a wafer i, i varying from 1 to K comprising on an insulating substrate at least one electronic component, the K wafers being electrically interlinked by conductors located on the lateral sides of the stack, wherein the fabrication is collective, comprising the steps of:
   a first step comprising, for each wafer i, in:
   A1) a step for fabricating a batch of n wafers i on one and the same flat thin sheet of thickness $e_p$ comprising silicon, covered on one face with a thin electrically insulating layer of thickness $e_i$, forming the substrate, with, on this face, grooves of width L1 and of depth greater than $e_i$ and less than $e_p+e_i$, these grooves delimiting at least n geometrical patterns, each pattern being provided with at least one silicon electronic component connected to electrical connection terminals disposed on said face, the terminals being linked to electrical connection elements extending at least as far as a groove, a hole-opening area being provided at the intersection of the grooves and of the connection elements, the transverse dimension of this area being less than L1, the components being coated with an insulating resin which also fills the grooves,
   B1) a thinning step by surface grinding of the other face of the sheet so as to reveal the resin of the grooves,
   a second step comprising:
   A2) stacking and assembling the K batches obtained on completion of the first step, so as to superimpose the opening areas, substantially one on top of the other,
   B2) drilling holes in the resin perpendicularly to the faces of the sheets through the entire thickness of the stack plumb with the opening areas, the transverse dimension of the holes being less than L1, so that the silicon is insulated from the wall of the hole by the resin,
   C2) metallizing the wall of the holes,
   D2) cutting the stack along the grooves in order to obtain the n electronic modules.

2. The method as claimed in claim 1, comprising, prior to the second step, a step for thinning the sheet by surface grinding of the face of the sheet comprising the components.

3. The method as claimed in claim 2, wherein, prior to the step D2, it comprises a step consisting in depositing an electrically insulating layer on one face of the stack parallel to the sheets, this layer comprising, at the level of each pattern, elements for electrically interconnecting the module which provide opening areas centered on the opening areas of the wafers, and which extend as far as these areas.

4. The method as claimed in claim 2, wherein the second step also comprises a step following the step for metallizing the walls of the holes, consisting in refilling the holes with resin in order to facilitate the subsequent cutting of the stack.

5. The method as claimed in claim 2, wherein the electronic component is an active or passive component or an MEMS.

6. The method as claimed in claim 1, wherein, prior to the step D2, it comprises a step consisting in depositing an electrically insulating layer on one face of the stack parallel to the sheets, this layer comprising, at the level of each pattern, elements for electrically interconnecting the module which provide opening areas centered on the opening areas of the wafers, and which extend as far as these areas.

7. The method as claimed in claim 1, wherein the second step also comprises a step following the step for metallizing the walls of the holes, consisting in refilling the holes with resin in order to facilitate the subsequent cutting of the stack.

8. The method as claimed in claim 1, wherein the electronic component is an active or passive component or an MEMS.

9. The method as claimed in claim 8, wherein the active component is a bare chip.

10. The method as claimed in claim 8, wherein the electrical connection elements straddle the grooves.

11. The method as claimed in claim 10, wherein the electrical connection elements link two terminals located either side of a groove.

12. The method as claimed in claim 11, comprising, prior to the cutting of the step D2, a step of electrically testing the resulting stack.

13. The method as claimed in claim 1, wherein at least one passive component is located in or on the sheet.

14. The method as claimed in claim 1, wherein the insulating thin layer is made of insulating resin.

15. The method as claimed in claim 1, wherein the electrical connection elements are etched bridges.

16. The method as claimed in claim 15, wherein the bridges are etched after having filled the grooves with resin and before coating the components with resin.

17. The method as claimed in claim 16, wherein the holes are drilled by dry etching.

18. The method as claimed in claim 1, wherein the electrical connection elements are wired filaments.

19. The method as claimed in claim 18, wherein the filaments are cropped along the grooves.

20. The method as claimed in claim 18, wherein the holes are drilled by liquid etching.

* * * * *